US009478611B2

(12) United States Patent
Chan et al.

(10) Patent No.: US 9,478,611 B2
(45) Date of Patent: Oct. 25, 2016

(54) VERTICAL NANOWIRE SEMICONDUCTOR STRUCTURES

(71) Applicant: IMEC VZW, Leuven (BE)

(72) Inventors: Boon Teik Chan, Leuven (BE); Clement Merckling, Evere (BE)

(73) Assignee: IMEC VZW, Leuven (BE)

( * ) Notice: Subject to any disclaimer, the term of this patent is extended or adjusted under 35 U.S.C. 154(b) by 52 days.

(21) Appl. No.: 14/715,041

(22) Filed: May 18, 2015

(65) Prior Publication Data

US 2015/0333122 A1 Nov. 19, 2015

(30) Foreign Application Priority Data

May 19, 2014 (EP) .................................. 14168913

(51) Int. Cl.
*H01L 29/66* (2006.01)
*H01L 29/06* (2006.01)
*H01L 29/10* (2006.01)
*H01L 29/786* (2006.01)
*H01L 29/04* (2006.01)
*H01L 29/20* (2006.01)
*H01L 29/34* (2006.01)
*H01L 21/02* (2006.01)
*B82Y 10/00* (2011.01)
(Continued)

(52) U.S. Cl.
CPC .......... *H01L 29/0676* (2013.01); *B82Y 10/00* (2013.01); *B82Y 40/00* (2013.01); *H01L 21/02538* (2013.01); *H01L 21/02603* (2013.01); *H01L 29/045* (2013.01); *H01L 29/1037* (2013.01); *H01L 29/20* (2013.01); *H01L 29/34* (2013.01); *H01L 29/413* (2013.01); *H01L 29/66469* (2013.01); *H01L 29/775* (2013.01); *H01L 29/78642* (2013.01); *H01L 29/78681* (2013.01)

(58) Field of Classification Search
CPC ..................... H01L 29/66666; H01L 29/7827
USPC ............................................ 257/329
See application file for complete search history.

(56) References Cited

U.S. PATENT DOCUMENTS 6,566,704 B2   5/2003   Choi et al.
6,740,910 B2   5/2004   Roesner et al.
(Continued)

FOREIGN PATENT DOCUMENTS

EP   0 951 047 A2   10/1999
WO   2010/062644 A2   6/2010
WO   2012/069606 A2   5/2012

OTHER PUBLICATIONS

European Search Report, European Application No. 14168913.3, dated Oct. 8, 2014.
(Continued)

*Primary Examiner* — Trung Q Dang
*Assistant Examiner* — Patricia Reddington
(74) *Attorney, Agent, or Firm* — McDonnell Boehnen Hulbert & Berghoff LLP

(57) ABSTRACT

An example semiconductor structure comprises a first surface and at least one nanowire, the at least one nanowire being perpendicular to the first surface, wherein the first surface is defect-poor and is made of a doped III-V semiconductor material, wherein the at least one nanowire is defect-poor and made of an undoped III-V semiconductor material having a lattice mismatch with the material of the first surface of from about 0% to 1%.

15 Claims, 8 Drawing Sheets

(51) Int. Cl.
*B82Y 40/00* (2011.01)
*H01L 29/775* (2006.01)
*H01L 29/41* (2006.01)

(56) References Cited

U.S. PATENT DOCUMENTS

| | | | |
|---|---|---|---|
| 7,446,025 | B2 | 11/2008 | Cohen et al. |
| 7,989,286 | B2 | 8/2011 | Cheong et al. |
| 8,637,849 | B2 | 1/2014 | Deligianni et al. |
| 8,895,337 | B1* | 11/2014 | Wang ............... H01L 33/18 257/E29.005 |
| 2003/0010971 | A1 | 1/2003 | Zhang et al. |
| 2008/0230802 | A1 | 9/2008 | Bakkers et al. |
| 2010/0006817 | A1* | 1/2010 | Ohlsson ............ B82Y 20/00 257/13 |
| 2011/0012085 | A1 | 1/2011 | Deligianni et al. |
| 2011/0049568 | A1 | 3/2011 | Lochtefelt et al. |
| 2013/0240983 | A1 | 9/2013 | Larrieu |

OTHER PUBLICATIONS

Yinggang Huang et al., InAs Nanowires Grown by Metal-Organic Vapor-Phase Epitaxy (MOVPE) Employing PS/PMMA Dlblock Copolymer Nanopatterning, Nano Lett., 2013, 13 (12), pp. 5979-5984, Nov. 25, 2013.

Katsuhiro Tomioka et al., Vertical III-V Nanowire-Channel on Si, ECS Transactions, 58 )7) 99-114 (2013).

Tomas Bryllert et al., Vertical High-Mobility Wrap-Gated InAs Nanowire Transistor, IEEE Electron Device Letters, vol. 27, No. 5, May 2006.

* cited by examiner a sufficiently low density of threading dislocations (and of crystal defects in general) in the first surface is to provide the first surface by growing a nanowire having a cross section larger than the cross section of the at least one nanowire. The top surface of this wider nanowire is in that

VERTICAL NANOWIRE SEMICONDUCTOR STRUCTURES

CROSS-REFERENCE TO RELATED APPLICATIONS

This application claims priority to European Patent Application Serial No. 14168913.3 filed May 19, 2014, the contents of which are hereby incorporated by reference in their entirety.

FIELD

The present disclosure relates to the field of vertical nanowire semiconductor structures. More specifically it relates to a field-effect transistor (FET) based on one or more vertical nanowire channels and to methods to make and implement the same.

BACKGROUND

In the context of CMOS scaling, it is established that below 7-nm CMOS generation, i.e. sub N7, the standard planar/FinFET architecture may switch to a vertical type of integration in order to continue scaling. Furthermore, electrostatic control may be improved. One solution is to develop an architecture based on gate-all-around (GAA) vertical nanowires. Furthermore, in order to boost the drive current performances of the device, a high mobility channel such as a III-V based channel may be used.

Based on the scaling predictions for N5 CMOS generation, the channel diameter may be smaller than 10 nm and more than one channel may be used in the device to increase drive current capabilities. Also, the channels may be as defect-free as possible in order to assure good electrical performances. Additionally, in the vertical architecture, the source/drain regions for contacts may be highly doped (n-type or p-type), e.g., in-situ, which could cause dopant diffusion in the channel which would degrade the carrier mobility. These issues represent key engineering challenges.

US Patent application 2013/0240983A1 discloses a process for fabricating a field-effect transistor device implemented on a network of vertical nanowires, including a plurality of elementary transistors, each elementary transistor comprising a source electrode and a drain electrode each positioned at one end of a vertical nanowire and connected by a channel, with a gate electrode surrounding each vertical nanowire. US Patent application 2013/0240983A1 discloses that these nanowires may be made from a group IV or group III-V materials and that these nanowires may be made top-down (e.g. via etching). Alternatively, they may be made bottom-up (e.g. growth). It does not disclose a way to grow nanowires and therefore may not address the problem of how to grow nanowire-based channels with high crystalline quality. As having a low defect density vertical nanowire may be helpful for device performance (e.g., for nanowire-based channels of FETs), there is still a need in the art for reducing the amount of defects in vertical nanowires and for methods to obtain the same.

SUMMARY

It is an object of the present disclosure to provide vertical semiconductor nanowires having a low defect density in the channel of the device.

It is another object of the present disclosure to provide methods to obtain the same.

In a first aspect, the present disclosure relates to a semiconductor structure comprising a first surface and at least one nanowire, the at least one nanowire forming an angle with said first surface (e.g., being perpendicular to said first surface), wherein the first surface has a low density of threading dislocations and is made of a doped (>1e19 at/cm$^3$) semiconductor material, wherein the at least one nanowire is made of an undoped (<1e17 at/cm$^3$) semiconductor material having a lattice mismatch with the material of the first surface of from about 0% to 1%, and wherein the doped (>1e19 at/cm$^3$) semiconductor material and the undoped (<1e17 at/cm$^3$) semiconductor material have each an electron mobility of at least 2000 cm$^2$/(V·s) and/or a hole mobility of at least 500 cm$^2$/(V·s). The at least one nanowire is abutting said first surface. One example way to obtain de facto a sufficiently low density of threading dislocations (and of crystal defects in general) in the first surface is to provide the first surface by growing a nanowire having a cross section larger than the cross section of the at least one nanowire. The top surface of this wider nanowire is in that embodiment the "first surface". This embodiment as well as alternatives are detailed in a later section of the present description. One example way to have de facto an electron mobility of at least 2000 cm$^2$/(V·s) and/or a hole mobility of at least 500 cm$^2$/(V·s) for the doped (>1e19 at/cm$^3$) semiconductor material and the undoped (<1e17 at/cm$^3$) semiconductor material is to use a III-V material for the doped (>1e19 at/cm$^3$) semiconductor material and to use a III-V material for the undoped (<1e17 at/cm$^3$) semiconductor material.

Expressed differently, the first aspect of the present disclosure may relate to a semiconductor structure comprising a first surface and at least one nanowire abutting said first surface and forming an angle with said first surface (e.g., being perpendicular to said first surface), wherein the first surface has a low density of threading dislocations and is made of a doped (>1e19 at/cm$^3$) semiconductor material, wherein the at least one nanowire is made of an undoped (<1e17 at/cm$^3$) semiconductor material having a lattice mismatch with the material of the first surface of from about 0% to 1%, and wherein the doped (>1e19 at/cm$^3$) semiconductor material and the undoped (<1e17 at/cm$^3$) semiconductor material are both III-V materials.

The present disclosure originates from the realization by the inventors that the lattice mismatch between the ubiquitous Si substrate and the high mobility III-V material typically used for the channel of vertical FETs (such as GaAs (4% mismatch), In$_{0.5}$Ga$_{0.5}$As (8% mismatch), InAs (12% mismatch), GaSb (12% mismatch), In$_{0.5}$Ga$_{0.5}$Sb (16% mismatch) and InSb (20% mismatch)) generates high defect density in the channel that negatively impact the electrical performance of the device.

In a second aspect, the present disclosure relates to a transistor comprising a semiconductor structure according to the first aspect.

In a third aspect, the present disclosure relates to a device comprising a transistor according to the second aspect.

In a fourth aspect, the present disclosure relates to a method for forming a semiconductor structure, said method comprising the steps of:

providing a first surface made of a doped (>1e19 at/cm$^3$) semiconductor material and having a low density of threading dislocations (e.g. of less than 106/cm$^2$), and growing at least one nanowire on said first surface and at an angle thereto, said at least one nanowire being made of undoped (<1e17 at/cm³) semiconductor material having a lattice mismatch with the material of the first surface of from about 0% to 1%, wherein the doped (>1e19 at/cm³) semiconductor material and the undoped (<1e17 at/cm³) semiconductor material have each an electron mobility of at least 2000 cm²/(V·s) and/or a hole mobility of at least 500 cm²/(V·s).

It is an advantage of embodiments of the present disclosure that good group III-V-based vertical gate-all-around field-effect transistors comprising at least one defect-poor nanowire of high crystalline quality as the channel can be obtained.

It is an advantage of embodiments of the present disclosure that the electrostatic control in the channel of the transistor is good, thereby leading to low leakage current density.

It is an advantage of embodiments of the present disclosure that it may reduce the area needed by the transistor on a wafer (due to the vertical architecture), thereby improving the density in electronic components.

It is an advantage of embodiments of methods of the fourth aspect of present disclosure that they can be CMOS compatible.

The above objective is accomplished by a method and device according to the present disclosure.

Particular and example aspects of the present disclosure are set out in the accompanying independent and dependent claims. Features from the dependent claims may be combined with features of the independent claims and with features of other dependent claims as appropriate and not merely as explicitly set out in the claims.

These and other aspects of the present disclosure will be exposed from and elucidated with reference to the embodiment(s) described hereinafter.

As used herein and unless provided otherwise, the term "nanowire" relates to a nanostructure having the shape of a rod and an aspect ratio of at least 2-5 and a width of at most 100 nm.

A "lattice mismatch" (f) of a material A with a material B is calculated with the formula f=Δa/a, wherein Δa is the lattice parameter of material *A minus* the lattice parameter of material B, and wherein a is the lattice parameter of material B.

A "threading dislocation" is a crystallographic defect, or irregularity, within a first crystalline structure, which is typically formed when said first crystalline structure is grown on a second mismatched crystalline structure. Growing a first crystalline structure on a second crystalline structure typically leads to the appearance of misfit dislocations to accommodate the lattice parameter difference at the substrate/layer interface. These misfits propagate as a threading dislocation in the above first crystalline structure.

The presence and density of such threading dislocations can be measured by X-ray diffraction (XRD) or by Transmission Electrons Microscopy (TEM).

As used herein and unless provided otherwise, the term "III-V" when characterizing a material, refers to a material made of compounds consisting of at least one group-III (IUPAC group 13) element and at least one group-V element (IUPAC group 15). This includes binary compounds but also higher order compounds such as ternary compounds. Examples include but are not limited to GaAs, InxGa1-xAs, InAs, GaSb, InxGa1-xSb, and InSb. In some instances, binary compounds may be used because their stoichiometry is easier to control.

A first aspect of the present disclosure relates to a semiconductor structure. This semiconductor structure is particularly useful in the fabrication of FETs but also in the fabrication of other devices in other fields such as sensors, NEMS, solar cells, etc.

In embodiments, the semiconductor structure may be a FET or an intermediated structure in the fabrication of an FET. The semiconductor structure comprises a first surface and at least one nanowire abutting thereto. The at least one nanowire can consist in a set of from 1 up to 20 nanowires. It can also be at least two nanowires as shown in the figures. In embodiments, each of the at least one nanowire may have a length of from 2 nm to 100 nm. In one example, at least 50% of the at least one nanowires have the same length. In another example, at least 70% of the at least one nanowires have the same length. In still another example, at least 90% of the at least one nanowires have the same length. The shape of the cross-section of each of the at least one nanowire is typically hexagonal. A hexagonal cross-section is typically indicative of a less defective crystalline structure than a non-hexagonal cross section. Each of the at least one nanowire is at an angle with the first surface and may be perpendicular thereto. Each of the at least one nanowire has one of its extremity abutting the first surface. The provided first surface has a low density of threading dislocations. The first surface is most typically monocrystalline. This permits the measure of said threading dislocation density. In an embodiment, the first surface has at most $10^6$ threading dislocation/cm². In another embodiment, the first surface is substantially free of threading dislocations. The provided first surface also typically has a low density of stacking faults and twin boundaries. In an embodiment, the first surface has at most $10^6$ stacking faults and twin boundaries combined/cm². Methods to obtain such defect-poor first surfaces are provided in the fourth aspect of the present disclosure. A stacking fault is a change in the stacking sequence over a few atomic spacings. A twin boundary is a change over many atomic spacings. These stacking faults and twin boundaries defects are parallel to the (1, 1, 1) orientation of a crystalline material. During the growth of the structure comprising the first surface, the number of defects gradually but relatively rapidly decreases with the increasing height of the structure. This is due to the accompanying relaxation of the crystal lattice for each new crystal layer grown on top of the preceding one. This way, the number of stacking faults and twin boundaries decreases to very low level once a sufficient height, and therefore a sufficient aspect ratio, has been achieved for the structure. In an embodiment, the structure comprising the first surface exhibits a gradual decrease in defect (e.g. threading defect) density from the bottom of the structure (i.e. the surface opposite to the first surface) toward the first surface. In embodiments, the aspect ratio may be 2 or more, 5 or more, 10 or more, or even 20 or more. Typically, the structure comprising the first surface is abutting a surface of a substrate in such a way as to stand vertically on that substrate. An advantage of using a (1, 1, 1) first surface is that it permits the growth of the at least one nanowire vertically thereon. Another advantage is that since the stacking faults and twin boundaries defects are parallel to the (1, 1, 1) orientation, a defect poor first surface is more easily and rapidly achieved.

The first surface is made of a highly doped semiconductor material (above 1e19 at/cm³). The semiconductor material has an electron mobility of at least 2000 cm²/(V·s) and/or a hole mobility of at least 500 cm²/(V·s). Example semiconductor materials are groups III-V semiconductor materials. The first surface may have Miller indices (1, 1, 1).

In an embodiment, the cross section of each of the at least one nanowire, averaged over the length of that nanowire, has a threading dislocation density of less than $10^6/cm^2$. In an embodiment, the cross section of each of the at least one nanowire, averaged over the length of that nanowire, has at most $10^6$ stacking faults and twin boundaries combined/$cm^2$. The at least one nanowire is made of an undoped semiconductor material (doping density<1e17 at/$cm^3$) having an electron mobility of at least 2000 $cm^2/(V \cdot s)$, a hole mobility of at least 500 $cm^2/(V \cdot s)$, and having a lattice mismatch with the material of the first surface of from 0% to 1%. Most typically, the nanowire, the structure comprising the first surface, and the first surface are all monocrystalline. This permits a lattice mismatch to be quantified. In one example, the lattice mismatch is from 0.0% to 0.5%. In another example, the lattice mismatch is from 0.0% to 0.2%. In still another example, there is no lattice mismatch. One way to avoid lattice mismatch is to use the same semiconductor material for the doped (>$10^{19}$ at/$cm^3$) first surface and for the undoped (<$10^{17}$ at/$cm^3$) nanowire (e.g. for the channel). Example semiconductor materials are groups III-V semiconductor materials. Another way to avoid lattice mismatch is to adapt the composition of a III-V material in order to match the lattice parameters of the first surface. For instance, a ternary III-V material can have its composition fine-tuned for that purpose. Low lattice mismatch is advantageous because it minimize strain in the nanowire and therefore strain-induced defects. In one example, the at least one nanowire may have a width of from 1 to 50 nm. In another example, the at least one nanowire may have a width of from 1 to 10 nm. Further, the at least one nanowire may have a length of from 2 to 100 nm, 5 to 50 nm, or 10 to 30 nm.

In embodiments, said at least one nanowire may have a first cross section, and the first surface may be a first extremity of a nanowire having a second cross section, larger than said first cross section. By larger cross-section, it is meant a cross-section having a larger width. Typically, a first nanowire having a larger cross-section than a second is equivalent to a nanowire having a larger width than a second nanowire. The second cross-section is sufficient for supporting said at least one nanowire having a first cross section. This may allow all the bases of the at least one nanowire having a first cross-section to fit in their entirety on the first surface. Typically, both the at least one nanowire having a first cross section and the nanowire having a second cross section may be rods of substantially uniform cross-section. This implies that it does not matter where the cross-section is measured along the nanowires. However, more generally, the width of the cross-section at the base (i.e. at the surface abutting the first surface) of the at least one nanowire may be smaller than the width of the cross-section at the first extremity (i.e. at the first surface) of the nanowire having a second cross section.

In embodiments, the second cross-section may be from 2 to 100 nm, 3 to 40 nm, or 4 to 30 nm.

In embodiments, the length (or height) of the nanowire providing the first surface may be from 10 to 200 nm or from 15 to 80 nm.

In this embodiment, since a nanowire is used to provide the first surface, the first surface will de facto have a sufficiently low density of defects (threading dislocations, stacking faults and twin boundaries) for the performance of the present disclosure (at least in so far as this nanowire has been grown by a bottom up process). In particular, there is no need to measure the density of defects of that first surface. This is typically already the case for a first surface provided by a nanowire having an aspect ratio of 2 or more and a height (length) of 10 nm or more.

As a non-limiting example, if said at least one nanowire is a set of seven nanowires having each a first cross-section having a width (or diameter) of 10 nm, the nanowire having a second cross-section could have a cross-section having a width of at least 30 nm to allow the seven bases to fit in their entirety on the first surface.

In embodiments, said nanowire having a second cross section possesses said first extremity and a second extremity and the second extremity is abutting a surface of a substrate.

In embodiments, said surface of a substrate may have Miller indices (1,1,1). Using such a substrate surface is advantageous as it permits growing thereon a nanowire comprising said first surface sharing the same Miller indices (1, 1, 1), thereby permitting the growth of the at least one nanowire vertically on said first surface. In embodiments, the substrate may be a silicon or germanium substrate. One advantage of the present disclosure is that it permits the use of the ubiquitous Si substrate despite its lattice mismatch with semiconductor materials having high electrons or holes mobilities such as III-V materials. Despite the use of Si as the substrate, embodiments of the present disclosure permit obtaining at least one nanowire that is defect-poor and that can be used as channels for an FET. Although starting from a III-V substrate is possible and remains within the broadest definition of the present disclosure, it is hardly compatible with CMOS processes. Various embodiments of the present disclosure show how to remain CMOS compatible by providing locally on a typical substrate (such as a Si substrate) a first doped (>1e19 at/$cm^3$) III-V surface on which at least one III-V nanowire can be grown.

In an example embodiment, the present disclosure may relate to a semiconductor structure comprising:

at least one nanowire made of an undoped (<1e17 at/$cm^3$) III-V material having a first cross-section, a base surface and a top surface, a nanowire made of a doped (>1e19 at/$cm^3$) III-V material and having a second cross-section, a base surface and a first surface opposite to the base surface, whereby the second cross-section is larger than said first cross-section and sufficient for allowing the base surfaces of the at least one nanowire having a first cross-section to fit in their entirety on the top surface of the nanowire having a second cross-section, wherein the at least one nanowire is perpendicular to said first surface and abutting thereto and wherein the III-V material of the at least one nanowire having a first cross-section has a lattice mismatch with the material of the nanowire having a second cross-section of from about 0% to 1%.

Nanowires see their amount of defects rapidly decreasing along the direction of their growth due to stress relaxation. Using a nanowire's top extremity as the first surface assures that the first surface will have a low density of defects if it is grown to a sufficient height. This in turn will assure that the at least one nanowire grown on this first surface will have a low density of defects. In embodiments, a sufficient height may be more than 10 nm. The high aspect ratio of nanowires is particularly favorable to quickly reach a sufficiently low density of defects.

In any embodiments, the semiconductor structure may further comprise a second surface made of a doped (>1e19 at/$cm^3$) III-V semiconductor material, wherein said at least one nanowire is sandwiched between said first surface and said second surface.

In embodiments, said second surface may be an extremity of a nanowire having a cross section sufficient for allowing the cross section (and therefore the top surfaces) of the at least one nanowire having a first cross-section to fit in their entirety on the second surface.

In a second aspect, the present disclosure relates to a field-effect transistor comprising a semiconductor structure according to the first aspect. In this second aspect, the at least one nanowire may comprise a channel or may form a corresponding number of channels of the field-effect transistor.

The first surface may belong to a source (or a drain) of the transistor and the second surface may belong to a drain (or a source) of the transistor. The transistor typically comprises a gate electrode.

A gate electrode may either i) comprise a layer of dielectric material embedding all of said at least one nanowire, and a layer of conducting material around said layer of dielectric material, or ii) comprise a number of layers of dielectric material, said number corresponding to the number of nanowires composing said "at least one nanowire", each of said layer surrounding one of said nanowires.

A gate electrode may comprise:
a layer of dielectric material surrounding a portion or the entirety of each of said at least one nanowire, and
a layer of conductive material around (each of) said layer of dielectric material.

The layer of conducting material may be unique for all of the at least one nanowire. The thickness of the layer of conducting material (in case i)) corresponds to the length of the gate of the transistor.

In embodiments, contacts between the source and the gate and between the drain and the gate may be insulated.

Typically, the field-effect transistor of the second aspect is implemented on at least one nanowire forming a corresponding number of channels sharing a same source and a same drain. The source is typically abutting at one end of the at least one nanowire and the drain is typically abutting at another end of the at least one nanowire, with the at least one nanowire forming the channel(s) connecting the source and the drain.

The field-effect transistor may comprise a dielectric material so as to insulate the source and the drain to form the contacts between the source and gate and between the drain and gate.

The conductive material forming the gate electrode can for instance be made from metal (e.g. TiN), silicide, amorphous silicon or polysilicon.

The dielectric material may be selected from oxides of silicon (e.g. silicon dioxide) and high-K dielectrics such as oxides of Al, Zr, Hf, Gd or La.

In a third aspect, the present disclosure relates to a device comprising a field-effect transistor according to the second aspect. In embodiments, the device may comprise a plurality of field-effect transistors according to the second aspect. Examples of such electronic devices are bio-sensors, chemosensors, volatile memory, non-volatile memory, CMOS inverter, multiplexers, and logic circuits.

In a fourth aspect, the present disclosure relates to a method for forming a semiconductor structure, said method comprising the steps of:
providing a first surface made of a doped ($>1e19$ at/cm$^3$) semiconductor material, said first surface having a low density of threading dislocations (e.g. less than $10^6$ per cm$^2$), and
growing at least one nanowire on said first surface and at an angle thereto, said at least one nanowire being made of undoped ($<1e17$ at/cm$^3$) semiconductor material having a lattice mismatch with the material of the first surface of from about 0% to 1% and wherein the doped ($>1e19$ at/cm$^3$) semiconductor material and the undoped ($<1e17$ at/cm$^3$) semiconductor material have each an electrons mobility of at least 2000 cm$^2$/(V·s) and/or a hole mobility of at least 500 cm$^2$/(V·s).

In embodiments, the doped ($>1e19$ at/cm$^3$) semiconductor material may be a doped ($>1e19$ at/cm$^3$) III-V semiconductor material.

In embodiments, the undoped ($<1e17$ at/cm$^3$) semiconductor material may be an undoped ($<1e17$ at/cm$^3$) III-V semiconductor material.

In embodiments, III-V semiconductor materials are high mobility materials, i.e. materials having an electron mobility of at least 2000 cm$^2$/(V·s) and/or a hole mobility of at least 500 cm$^2$/(V·s). Electron and hole mobilities can be measured by Hall Effect on bulk material.

In embodiments, the step of providing a first surface having a low density of threading dislocations (e.g. less than $10^6$ threading dislocation defects/cm$^2$) may comprise growing a semiconductor structure to a height sufficient for its top surface to have said low density of threading dislocations.

Alternatively, a defect-poor first surface (e.g. having less than $10^6$ threading dislocation defects/cm$^2$, and/or having at most $10^6$ stacking faults and twin boundaries combined/cm$^2$) may be a full wafer of semiconductor material serving as the substrate, or it can be a portion of a full wafer that has been etched to any desirable dimension or that has been separated from the wafer and that is used as the substrate or that is attached (e.g. glued) on a substrate. However, said at least one nanowire may have a first cross-section, and the step of providing a first surface having a low amount of defects (e.g. having less than $10^6$ threading dislocation defects/cm$^2$) may comprise growing a nanowire having a cross-section larger than said first cross-section and sufficient for supporting said at least one nanowire having a first cross-section.

In embodiments, providing a first defect-poor surface (e.g. having less than $10^6$ threading dislocations/cm$^2$) may comprise the following steps:
providing a substrate,
providing a patterned oxide layer on said substrate, thereby leaving exposed a portion of the substrate,
growing a doped ($>1e19$ at/cm$^3$) semiconductor material on said portion, wherein said material is grown either to a height sufficient for the top surface of said material to have less than $10^6$ threading dislocations/cm$^2$, and/or to a height of at least 10 nm and sufficient for providing an aspect ratio of 2 to the grown doped semiconductor material (this correspond to growing on said portion a nanowire having a length of at least 10 nm said length being at least twice the width of this nanowire).

In embodiments, providing a patterned oxide layer on said substrate may comprise the following steps:
providing an oxide layer on said substrate,
providing a patterned hard mask on said oxide layer, and
transferring the pattern of the hard mask to the oxide layer, thereby leaving exposed a portion of the substrate.

In embodiments, providing a patterned hard mask may comprise the following steps:
providing a hard mask on said oxide layer,
providing a patterned photoresist on said hard mask, and
transferring the pattern of the photoresist to the hard mask.

In embodiments, after the step of growing a doped ($>1e19$ at/cm$^3$) semiconductor material on said portion, the method may further comprise the following steps aiming at planarizing said defect-poor first surface:

providing a barrier layer on said first surface (and in practice also typically on part of the patterned oxide layer), and planarizing said barrier layer until said first surface is exposed and is itself planarized.

In embodiments, after the step of growing a doped (>1e19 at/cm$^3$) semiconductor material on said portion, and after planarization is performed, the method may further comprise the following steps:

providing a patterned protective layer on the first surface, wherein said pattern comprises holes having a width of from 1 to 20 nm and wherein said protective layer is made of a material that can be etched selectively with respect to the first surface. The holes are exposing portions of the first surface. FIG. 12 is an illustration of the end result of this embodiment where the top layer 120 is the patterned protective layer. In practice, the patterned protective layer will be provided on the first surface but will also typically extend beyond that surface (see FIG. 12 where the top layer 120 also extends on the barrier layer 130). The holes will typically have a length of from 1 to 20 nm. The width and the length of the holes are typically within 50% or one another and more typically equal.

In embodiments, providing a patterned protective layer on the first surface may comprise the following steps:

overlaying said first surface with a protective layer, providing a patterned mask on said protective layer, wherein said pattern comprises holes of width of from 1 to 20 nm, and etching said protective layer through said holes and selectively with respect to the first surface.

The step of overlaying said first surface with a protective layer is illustrated for an embodiment in FIG. 6. In that figure, the protective layer bears number 120 (top). In practice, the patterned protective layer will be provided on the first surface but will also typically extend beyond that surface (see FIG. 6 where the top layer 120 also extends on the barrier layer 130). In the step of providing a patterned mask, the holes are vertically aligned with portions of the first surface that will be exposed in the etching step. The end result of the step of providing a patterned mask on said protective layer is illustrated for an embodiment in FIG. 10 where the patterned mask is made of polystyrene. The end result of the etching step is illustrated in an embodiment in FIG. 11.

In embodiments, providing a patterned mask on the protective layer may comprise the following steps:

providing a patterned hard mask on said protective layer, leaving portions of the protective layer exposed (this is illustrated for an embodiment in FIG. 7 where the exposed portions are above the first surface so that a vertical projection of the exposed portions is comprised in the first surface), providing a layer of a block-copolymer on said portions, said block-copolymer being formed of at least two block types, wherein one of said block types is suitable for forming vertical structures spanning the thickness of the layer upon annealing (this is illustrated for an embodiment in FIG. 8), annealing said block-copolymer, thereby generating said vertical structures (this is illustrated for an embodiment in FIG. 9), and removing said vertical structures by etching (e.g., plasma etching or wet etching), thereby forming a hole pattern in said block-copolymer, thereby forming the patterned mask (this is illustrated for an embodiment in FIG. 10).

In the step of providing a patterned hard mask, the exposed portions are typically vertically aligned with portions of the first surface on which the one or more nanowire will be grown.

The substrate may be as defined in any embodiment of the first aspect.

The oxide layer may be $SiO_2$ and may have a thickness equal to the height of the at least one nanowire. For instance, the thickness may be from 1 to 20 nm or from 1 to 10 nm.

The hard mask can be any material that can: be patterned and which pattern can be transferred into an oxide layer such as e.g. $SiO_2$, and be removed easily (e.g. by plasma or wet etch). The hard mask is typically harder than the photoresist.

The hard mask can for instance be a silicon oxycarbide (SiOC)/amorphous carbon stack, a spin-on-glass (SoG)/spun on carbon (SoC) stack, a $SiO_2/Si_3N_4/SiO_2$ stack, or a $Si_3N_4$/amorphous silicon (a-Si) stack.

The amorphous carbon can for instance be a PECVD ashable amorphous carbon film of the Advanced Patterning Film™ (APF™) type.

The block-copolymer may be a polymer having two or more chemically different polymer blocks, for example a di-block, tri-block, star, comb or other polymer with controlled structure. The blocks may typically have different chemical properties, such as the degree of hydrophilicity or hydrophobicity. The blocks may typically be mutually immiscible, or only partially miscible, (at least) over a range of temperatures, e.g. to allow formation of separate microphase domains, thus enabling self-assembly. Self-assembly may be based on chemical differences between the different polymer blocks, e.g. a hydrophilicity/hydrophobicity imbalance. Such block-copolymers may be obtained by methods known in the art, for example by atom transfer radical polymerization, reversible addition fragmentation chain transfer polymerization, nitroxide-mediated polymerization, boron-mediated polymerization or catalytic chain transfer polymerization.

Annealing relates to a process that allows self-assembly of structures by micro-phase separation in a block-copolymer material. This process may for instance comprise heating up the block-copolymer or contacting the block-copolymer with a solvent, or both. Typically, it consists in heating up the block-copolymer. Upon annealing, the chemically different polymer blocks undergo a microphase separation, which is driven by repulsion between the dissimilar polymer chains, such that homogenous domains in a periodic nanostructure are formed after annealing. For example, such periodic structures may comprise hexagonally packed cylinders. The type of structure which is formed is furthermore controllable by tuning the ratios of the different polymer block lengths.

In embodiments, the block-copolymer may be a block-copolymer comprising at least two polymer components having mutually different etching resistances and forming a pattern structure by micro-phase separation of the at least two polymer components upon annealing. The block-copolymer may comprise at least two polymer components having mutually different etching resistances. For example, a polymeric composition consisting of two or more chemically different homopolymer blocks connected by covalent bonds at their chain ends may be coated onto the portion, e.g. by brushing, rolling, spraying, inkjet application or spin-coating. The polymeric composition may furthermore comprise additives, e.g. adhesives, adhesion promoters and/or solvents. For example, the block-copolymer may be formed from a di-block copolymer composition comprising two types of polymer chains covalently bonded to each other. For example, such di-block copolymer may comprise polystyrene-polyisobutene, polystyrene-isoprene, polydimethylsiloxane-polyisobutene, polystyrene-polyethylene oxide, polystyrene-polypropylene oxide, polyethyleneoxide-poly(cyanobiphenyloxy)hexyl methacrylate, polystyrene-polymethacrylic acid, polyethylene oxide-polyvinylpyridine, polystyrene-polyvinylpyridine, or polyisoprene-polyhydroxystyrene. Such di-block copolymer may comprise polystyrene (PS) chains covalently bonded to polymethyl methacrylate (PMMA) chains, in which the polystyrene and PMMA have an advantageous etch resistance ratio for dry etching with argon plasma. Alternatively, the self-organizing block-copolymer layer may be formed from a tri-block copolymer composition, for example in which two types of polymer chains A,B are bonded in an A-B-A form or in which three types of polymer chains A,B,C are bonded in an A-B-C form. In an embodiment, one of said polymer component (e.g. said second polymer component) may be polystyrene.

In an embodiment, one of said polymer component (e.g. said first polymer component) may be PMMA.

The self-organizing block-copolymer layer furthermore has a copolymer pattern structure which can be formed by micro-phase separation of the at least two polymer components upon annealing. For example, the block-copolymer coated onto the portion may be annealed, e.g. at a temperature higher than the glass-transition or melting temperature, during which the components of the block-copolymer may self-assemble into structured domains, thus forming the copolymer pattern structure. For example, thermal annealing may be used at a temperature above the lowest value of the glass transition or melting temperature of at least one polymeric component of the composition. Annealing time may be selected to allow self-assembly, and may be in the range of 0.01 hours to 300 hours, or between 0.1 hours and 24 hours. Prior to the annealing, a pre-bake may be performed in order to remove any residual solvent after block-copolymer deposition (e.g. by spin-casting). In the case of a PS-PMMA block co-polymer, this pre-bake may for instance be performed at a temperature within the range 70° C.-130° C. (e.g. 100° C.) for 30-120 seconds (e.g. 60 seconds). It is advantageous to choose pre-bake conditions that lead to a uniform film across the substrate. In the case of a PS-PMMA block co-polymer, the actual annealing of the block-copolymer may for instance be performed at a temperature of from 200° C.-300° C. (e.g. 250° C.) for a time span of from 100 to 500 seconds (e.g. 300 seconds) in an oven under inert (e.g. $N_2$) atmosphere.

By selecting an appropriate total chain length and molecular weight of each block in the block-copolymer, e.g. selecting an appropriate Flory Huggins parameter, as known in the art, the morphology of this copolymer pattern structure may be tuned in order to create e.g. cylinders in the block-copolymer layer. The molecular weight of the block-copolymer may be, for example, selected such that the end-to-end distance of the blocks is commensurate with the smallest feature of the intended pattern. Example molecular weights may range, for example, from 200 to 1000000 g/mol, e.g. from 2000 to 100000 g/mol.

The protective layer may be an oxide layer. In embodiments, this oxide layer can be a silicon oxide layer such as $SiO_2$. $SiO_2$ is advantageous because it can be etched very selectively compared to III-V materials. The etching method used therefore is typically a wet etch.

The step of providing a patterned mask on said protective layer can for instance comprise:
providing a hard mask on said protective layer,
providing a patterned photoresist on said hard mask, and
transferring the pattern of the photoresist to the hard mask, thereby exposing a portion of the protective layer.

The step of growing undoped (<1e17 at/cm³) semiconductor nanowires may be performed by epitaxial growth, i.e. by exposing the first surface to gaseous or liquid precursors of semiconductor nanowires (e.g. of III-V semiconductor nanowires), thereby using the first surface as a seed for growing the nanowire.

In order for the length of the nanowires to be made uniform and for their top surface to be made planar, an oxide (e.g. $SiO_2$) may be deposited to cover (and embed) the undoped (<1e17 at/cm³) nanowires, then chemical mechanical planarization may be performed to planarize the top of the undoped (<1e17 at/cm³) nanowires (126).

In embodiments, the method may further comprise providing a second surface made of a doped (>1e19 at/cm³) III-V semiconductor material, so that said at least one nanowire is sandwiched between said first surface and said second surface.

In embodiments, providing a second surface may comprise the following steps:
providing an oxide to cover (entirely) the at least one undoped (<1e17 at/cm³) semiconductor nanowire,
planarizing the top of the at least one nanowire,
providing a patterned oxide layer (at least) on top of the at least one nanowire in such a way as to at least leave the top of the at least one nanowire exposed, and
growing a doped (>1e19 at/cm³) semiconductor material at least on said exposed tops parts, thereby providing said second surface. The second surface is abutting the top of the at least one nanowire.

In embodiments, providing a patterned oxide layer on the first surface may comprise the following steps:
providing an oxide layer on top of the at least one nanowires,
providing a patterned hard mask on said oxide layer,
transferring the pattern of the hard mask to said oxide layer.

In embodiments, providing a patterned hard mask on said oxide layer may comprise the following steps:
providing a hard mask on said oxide layer,
providing a patterned photoresist on said hard mask, and
transferring the pattern of the photoresist to the hard mask.

In embodiments, the doped (>1e19 at/cm³) semiconductor material grown on said exposed parts may be as described for the doped (>1e19 at/cm³) semiconductor used to obtain the first surface. The step of growing the undoped (<1e17 at/cm³) semiconductor may also be as described for the growing of the doped (>1e19 at/cm³) semiconductor used to obtain the first surface.

Once the second surface has been provided, the resulting structure comprises a first surface, at least one nanowire and a second surface. This structure can be an intermediate in the construction of an FET wherein the at least one nanowire may be at least one channel, the first surface belongs to a source (or a drain) and the second surface belongs to a drain (or a source). In order to complete the FET, the following steps may be performed:
providing a barrier layer on the doped (>1e19 at/cm³) semiconductor material providing said second surface,
planarizing the barrier layer until the top of the doped (>1e19 at/cm³) semiconductor material becomes exposed and is planarized, optionally providing an antireflective coating layer on the doped (>1e19 at/cm$^3$) semiconductor material and the barrier layer, providing a photoresist on the antireflective layer (if present) or directly on part of the barrier layer and on the doped (>1e19 at/cm$^3$) semiconductor material, etching the antireflective coating if present, etching partially into the oxide layer, removing the photoresist, selectively removing the remaining oxide material without removing the barrier layer, depositing conformally a dielectric layer on the at least one nanowire, and providing a metal coating on the dielectric layer In general, any element mentioned in the fourth aspect may be as described for the same element mentioned in the first aspect.

Figure 1:
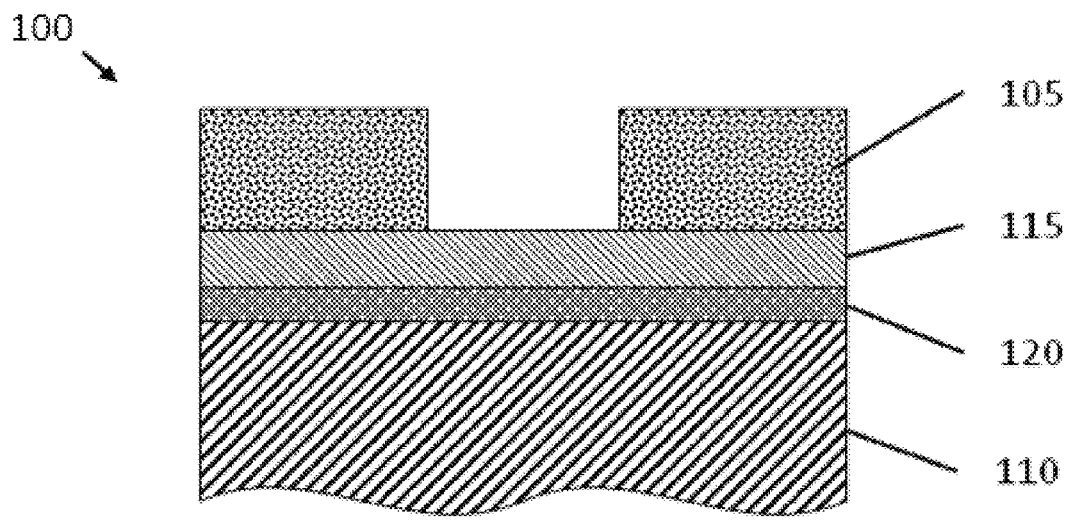
FIGS. 1-24 are example schematic representations of various process steps, as used in embodiments of the present disclosure.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION

The present disclosure will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions may not correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the present disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the present disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be exposed to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the present disclosure, and form different embodiments, as would be understood by those in the art. For example, in the following claims, any of the claimed embodiments can be used in any combination.

In the description provided herein, numerous specific details are set forth. However, it is understood that embodiments of the present disclosure may be practiced without these specific details. In other instances, well-known methods, structures and techniques have not been shown in detail in order not to obscure an understanding of this description.

FIGS. 1 to 24 illustrate an embodiment of a method according to the fourth aspect of the present disclosure. In this embodiment, a field-effect transistor is produced. Each figure represents an intermediate stage of the method.

FIG. 1 shows a semiconductor substrate (110) having a surface of Miller indices (1, 1, 1). Providing a semiconductor substrate having a surface of Miller indices (1,1,1) is advantageous because it allows, if the doped (>1e19 at/cm3) III-V semiconductor material grown is a nanowire, for this nanowire to grow perpendicular to the substrate.

An oxide layer (120) is provided on top of said substrate (110). This oxide layer (120) may for instance be a SiO2 layer (120). A suitable thickness for this layer (120) is typically less than 20 nm and for instance 10 nm or less. A hard mask (115) is then provided on top of said oxide layer (120). An intermediate metal layer (not shown, e.g. 10 nm TiN) can be present between the oxide layer (120) and the hard mask (115). This hard mask (115) can for instance be a multilayer structure (not represented) such as a 70 nm amorphous carbon film (APF™), covered by a 20 nm SiOC layer. Finally, a patterned photoresist (105) is provided on top of the hard mask (115).

Figure 2:
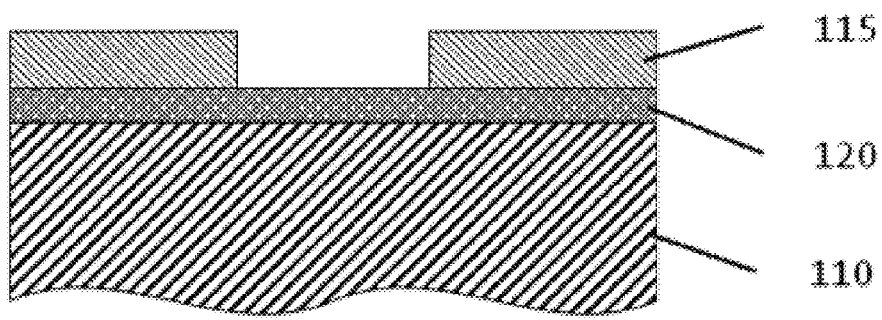

In FIG. 2, the pattern of the photoresist (105) is transferred to the hard mask (115). If the hard mask (115) was the multilayer described above, this pattern can be transferred by etching the SiOC through the patterned photoresist (105), followed by etching the amorphous carbon film thereby also consuming and therefore removing the photoresist (105) and then removing the remaining SiOC by wet (HF) or dry etch, followed by etching the TiN layer, and removing the amorphous carbon film by ashing.

Figure 3:
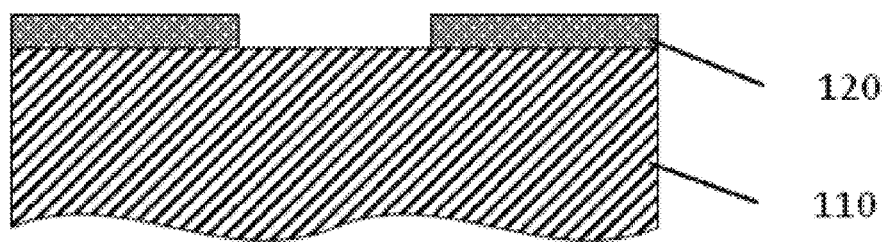

In FIG. 3, the pattern of the hard mask (115) is transferred to the oxide layer (120), thereby forming an oxide template (120) and exposing a portion of the semiconductor substrate (110). The exposed portion is not crucial and may for instance have an elliptic or a rounded square shape. The etching of the oxide layer (120) may, for example, be performed by a wet etching step for reasons detailed hereafter. In the case of an $SiO_2$ oxide layer (120) and of the multilayer hard mask (115) exemplified above, this transfer can be performed by wet etching the $SiO_2$ layer (120) with diluted HF by using the patterned TiN layer as a mask. The use of such a wet etching permits to have a better selectivity toward the $SiO_2$ and therefore to spare the semiconductor substrate (e.g. a Si substrate) (110). The resulting undamaged substrate (110) surface is such as to promote the growth of a structure (125) of high crystalline quality on top of which high quality nanowires (126) will be grown in a subsequent step. The rest of the TiN is then etched.

Figure 4:
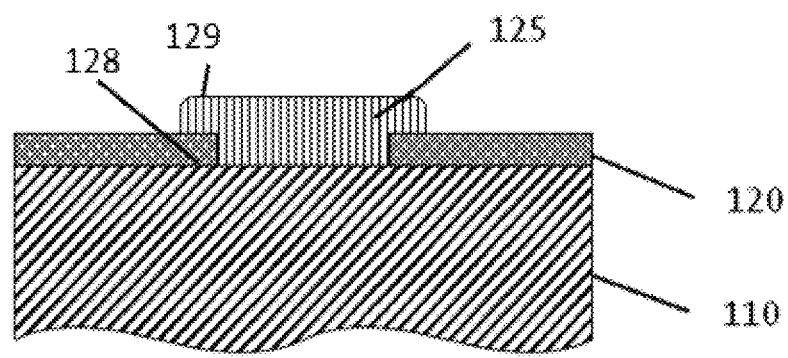

In FIG. 4, a structure (125) made of a doped (>1e19 at/cm$^3$) III-V semiconductor material is grown on said portion of the semiconductor substrate (110). This structure (125) will form the source (or drain) of the transistor and may be a nanowire (125). The structure represented in FIGS. 4-24 however is not depicted as a nanowire (125) but as a more general structure (125) which height and/or aspect ratio is such as to provide a top surface having a threading dislocation defect density lower than $10^6$ defects/cm$^2$. This structure (125) may be a nanowire (125). When this structure (125) is a nanowire (125), the thickness of this nanowire (125) can for instance be in the range 20-30 nm. The base (128) (i.e. the bottom layer of the structure (125) which is at the interface with the substrate 110) of this structure (125) is far from being defect-free due to lattice and/or material mismatch between the material of the substrate (110) and the III-V material of the structure (125). Also, the base of the structure (e.g. a nanowire) (125) tend to expand beyond the actual area of said portion of the semiconductor substrate (110) (e.g. by 12%) to form a hexagonal base shape. The top of the structure (125) however has less than $10^6$ threading dislocations/cm$^2$ because the structure (125) (e.g., a nanowire) is grown to a sufficient height, permitting the tensions due to the lattice and/or material mismatch to relax. The top of the nanowire (125) will serve as the first surface on which one or more nanowires (126) of smaller cross sections (e.g. 10 nm diameter) will be grown. In embodiments where the structure (125) is a structure with an aspect ratio of at least 2 and in embodiments where the structure (125) is a nanowire (125), the structure (125) would appear higher than its width in FIGS. 4-24 to reflect its vertical position and its high aspect ratio (contrarily to the more general structure (125) shown in FIGS. 4-24 which is depicted wider than its height).

Figure 5:
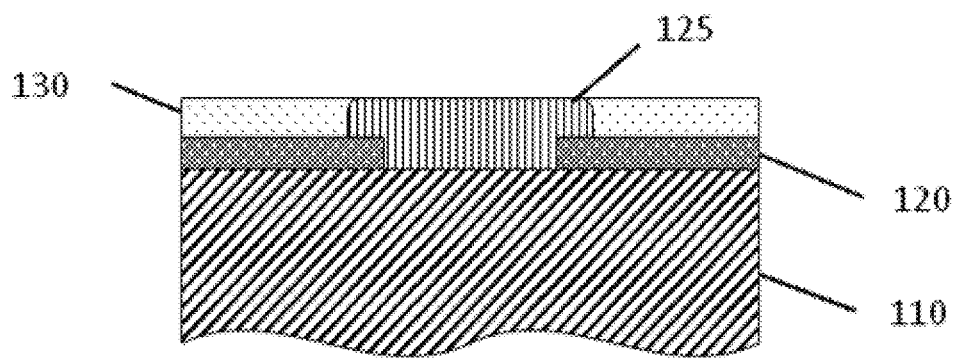

In FIG. 5, a barrier layer (130) is provided on the first surface. This barrier layer (130) can for instance be a $Si_3N_4$ layer (130). It is then planarized via chemical mechanical planarization until the first surface becomes exposed and is made planar.

Figure 6:
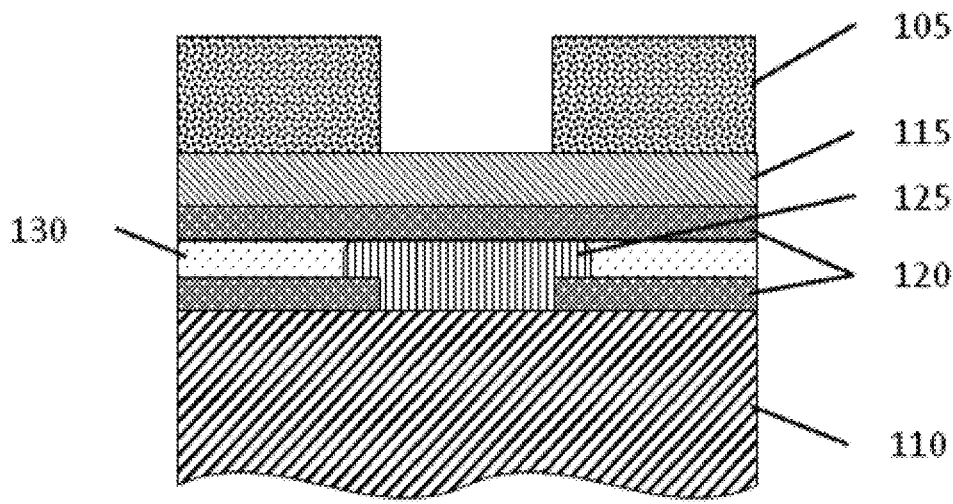

In FIG. 6, steps analog to the steps performed in FIG. 1 are performed: an oxide layer (120) is provided on the structure (125) and the barrier layer (130). A hard mask (115) is then provided on the oxide layer (120). Then, a patterned photoresist (105) is provided on the hard mask (115).

Figure 7:
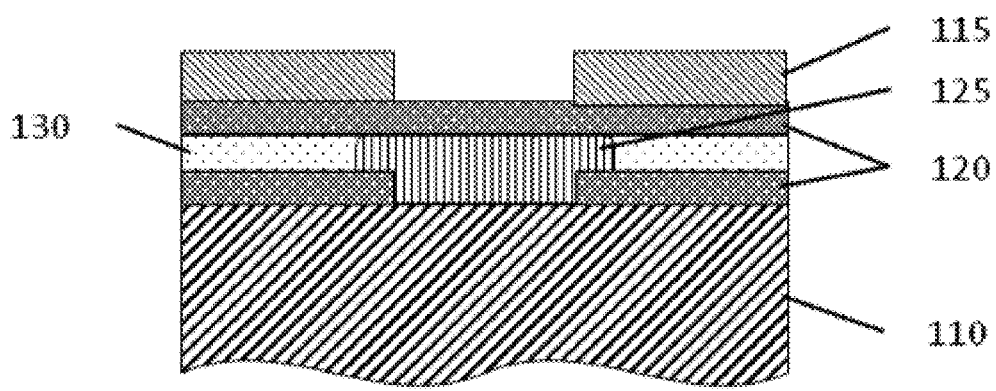

In FIG. 7, steps analog to the steps performed in FIG. 2 are performed: the pattern of the photoresist (105) is transferred to the hard mask (115), thereby exposing a portion of the oxide layer (120).

Figure 8:
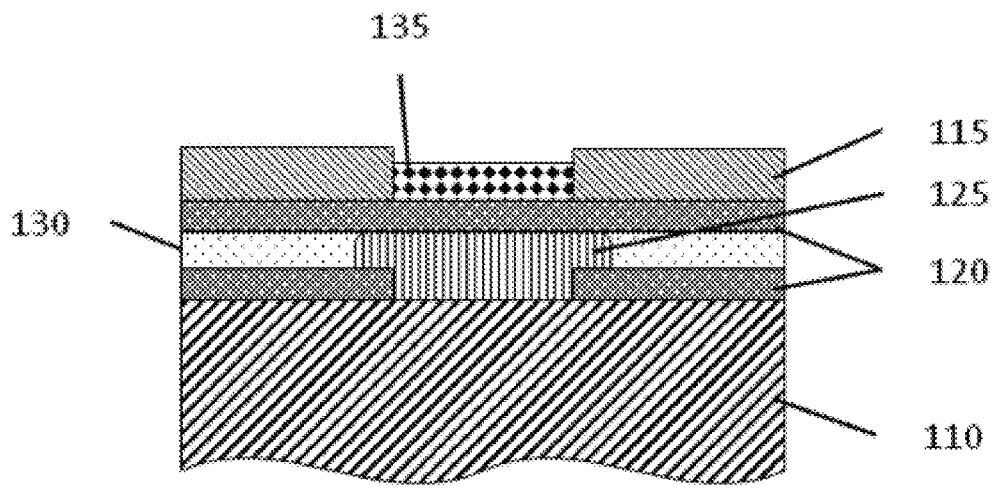

In FIG. 8, a layer (135) of block-copolymer is provided on said portion of the oxide layer (120), said block-copolymer being formed of at least two block types, wherein one of said block types is suitable for forming vertical structures spanning the thickness of the layer (135) upon annealing. This block-copolymer can be for instance a PS-b-PMMA block co-polymer. The vertical structures (137) are typically cylinders of small diameters. For instance, cylinders of 15 nm diameter could be achieved with a PS-b-PMMA block co-polymer (with a pitch of 37 nm). Diameters of less than 15 nm can however be achieved with high-chi block-copolymers. The size of the vertical structures (137) can be controlled by varying the characteristics (e.g. the molecular weight) of the block-copolymer.

Figure 9:
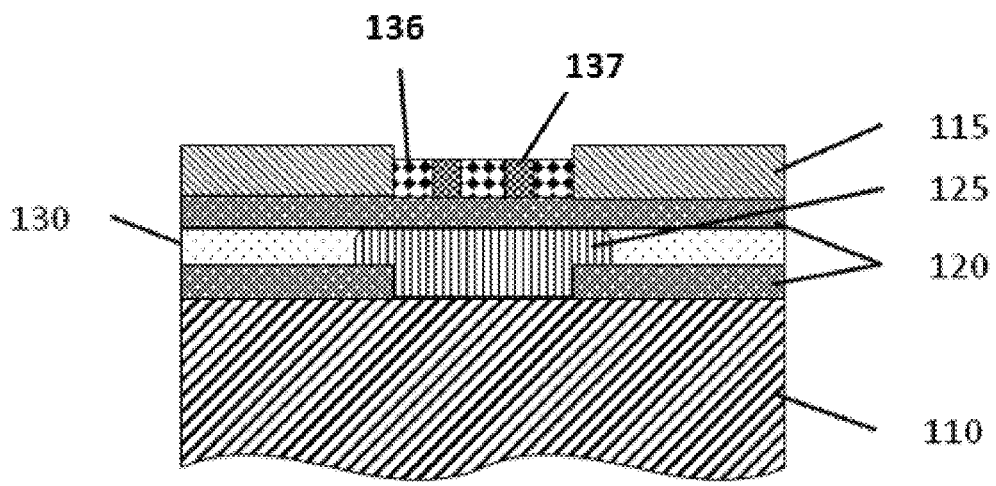

In FIG. 9, the block-copolymer layer (135) is annealed, thereby creating the vertical structures (137) (in the case of a PS-PMMA block co-polymer, these vertical structures are made from the PMMA blocks (137) which are phase separated from the PS blocks (136)).

Figure 10:
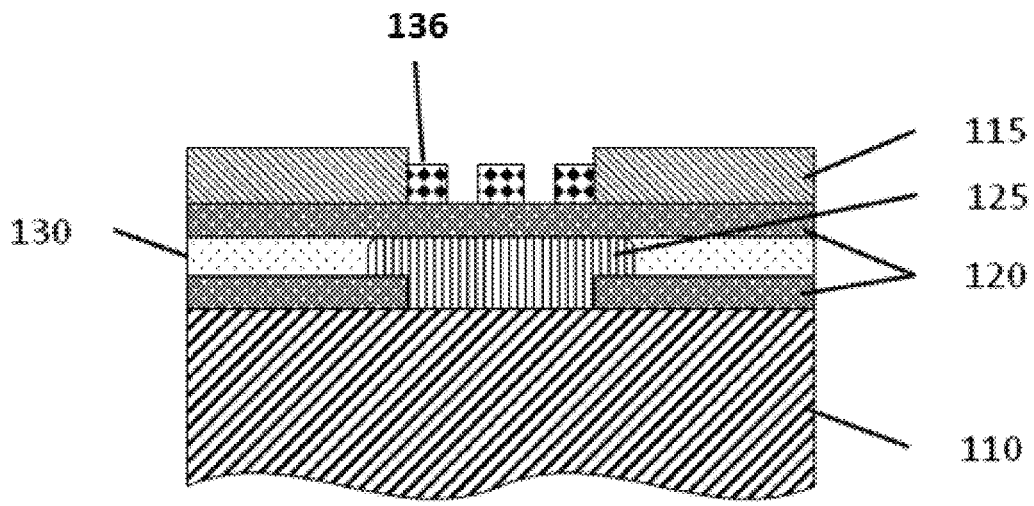

In FIG. 10, these vertical structures (e.g. PMMA) are removed by wet etching, thereby forming a hole pattern in a PS layer where the block-copolymer layer was previously present.

Figure 11:
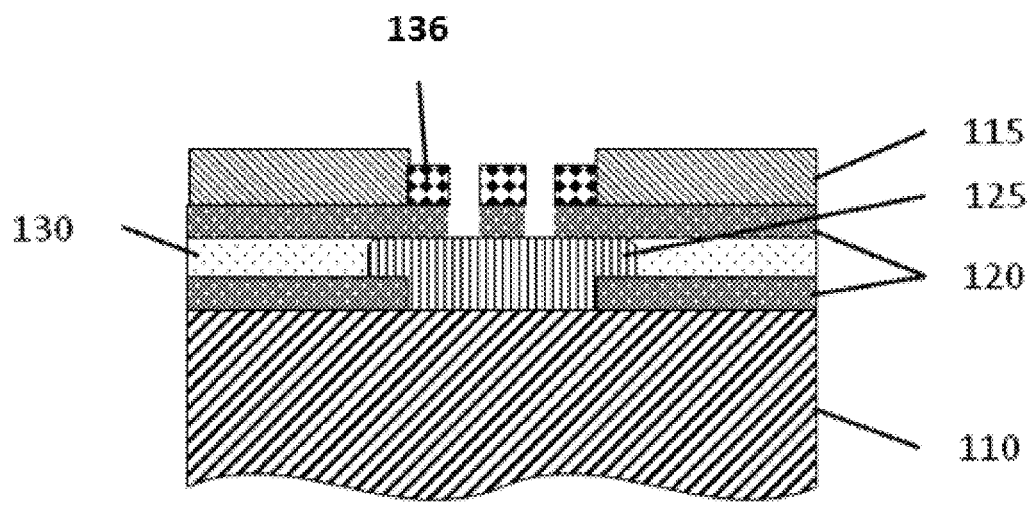

In FIG. 11, the hole pattern is transferred to the oxide layer (120) thereby exposing part of the first surface (129). This can be performed by etching, for instance wet etching.

Figure 12:
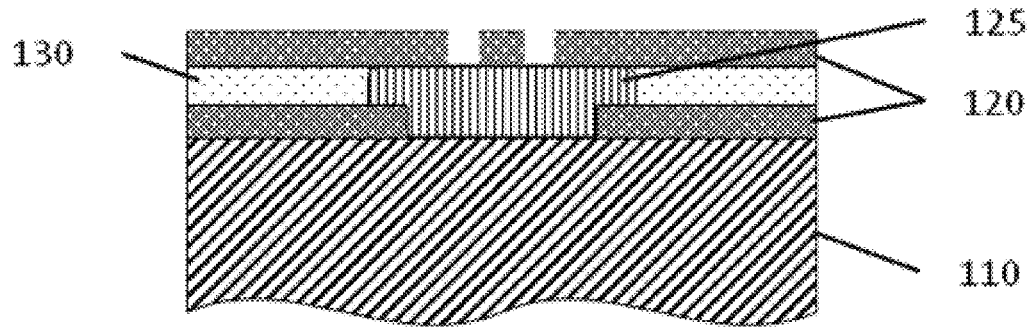

In FIG. 12, the PS blocks (136) are removed and then the hard mask (115) is removed (e.g. by a wet process), thereby exposing part of the first surface (129). The exposed part is composed of one or more holes of small dimensions (e.g. 30 nm diameter).

Figure 13:
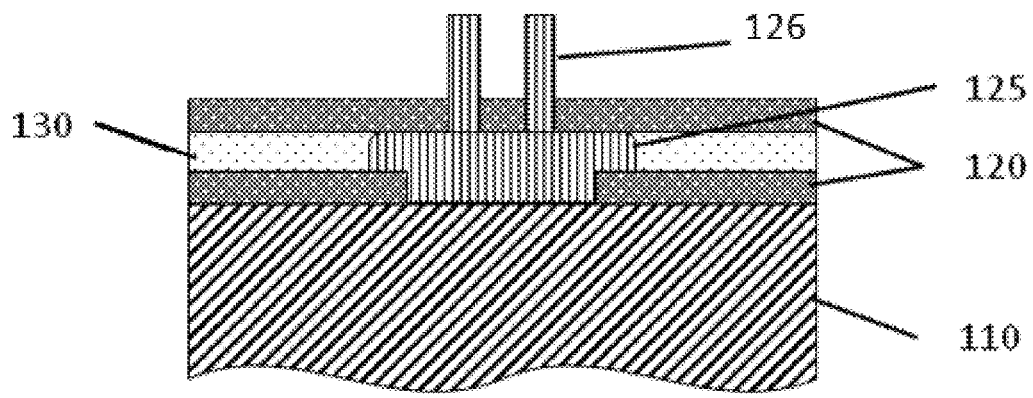

In FIG. 13, undoped (<1e17 at/cm$^3$) III-V nanowires (126) are grown on said part of the first surface. The lattice mismatch between the first surface and the undoped (<1e17 at/cm$^3$) III-V nanowires (126) is minimal or not existing. The undoped (<1e17 at/cm$^3$) III-V nanowires (126) will serve as channels for the transistor.

Figure 14:
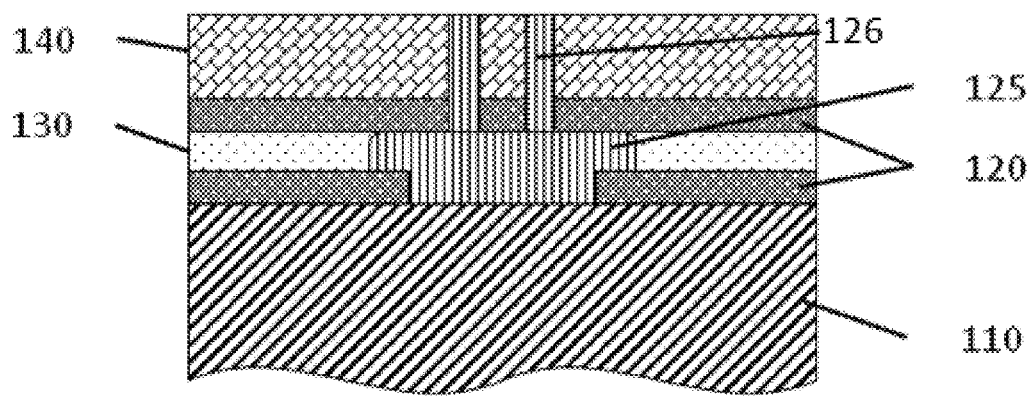

In FIG. 14, an oxide (e.g. $SiO_2$) (140) is deposited to cover (and embed) the undoped (<1e17 at/cm$^3$) nanowires (126), then chemical mechanical planarization is performed to planarize until the top of the undoped (<1e17 at/cm$^3$) nanowires are exposed (126).

Figure 15:
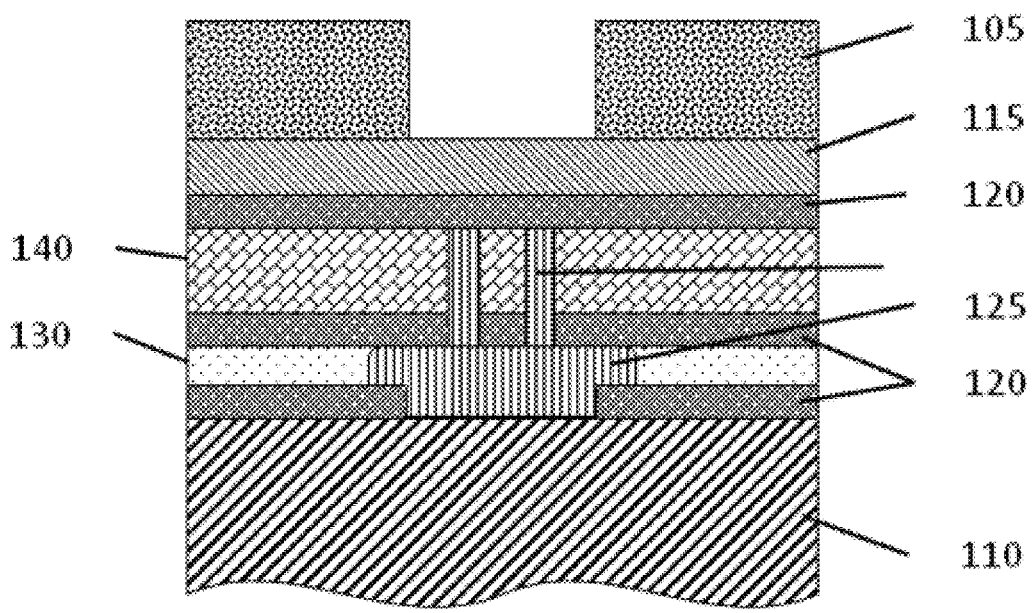

In FIG. 15, steps analog to the steps performed in FIG. 1 or 6 are performed: an oxide layer (120) is provided on top of the undoped (<1e17 at/cm$^3$) nanowires (126) (and on top of oxide (140)) and a hard mask (115) is provided on top of said oxide layer (120). Finally, a patterned photoresist (105) is provided on top of the hard mask (115).

Figure 16:
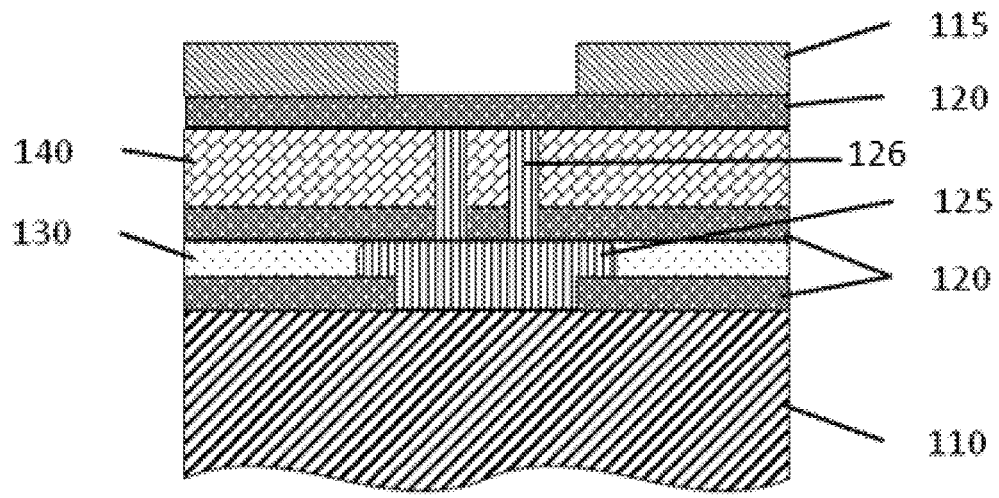

In FIG. 16, steps analog to the steps performed in FIG. 2 or 7 are performed: the pattern of the photoresist (105) is transferred to the hard mask (115).

Figure 17:
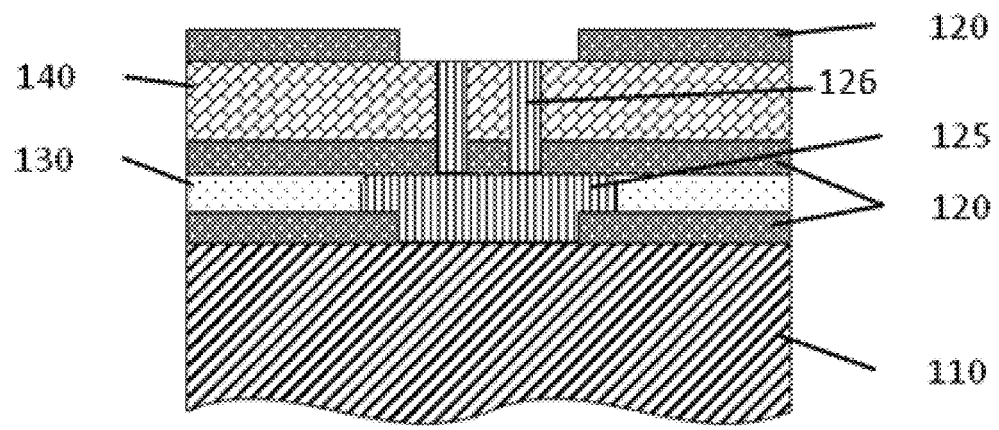

In FIG. 17, the pattern of the hard mask (115) is transferred to the oxide layer (120), thereby forming an oxide template (120) and exposing the top of the undoped (<1e17 at/cm$^3$) nanowires (126) (as well as exposing a portion of the oxide (140)).

Figure 18:
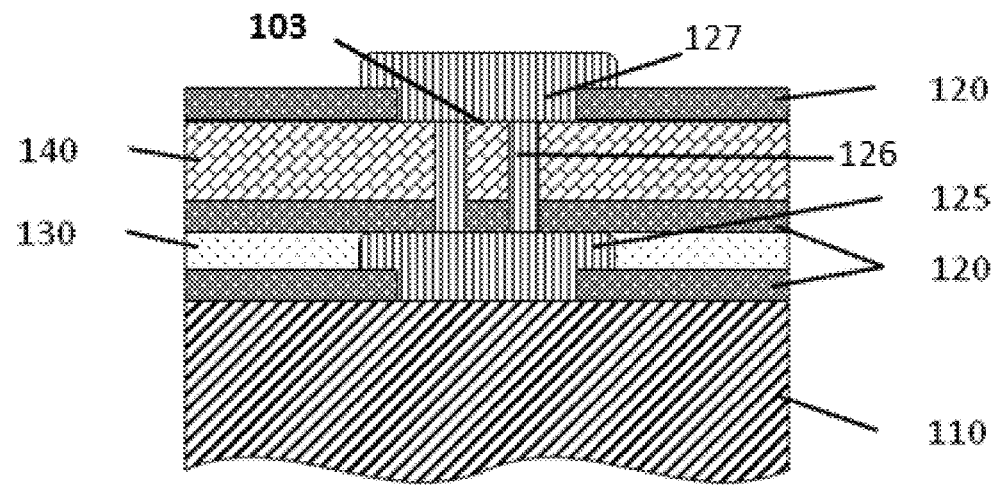

In FIG. 18, a second structure (127) made of a doped (>1e19 at/cm$^3$) III-V semiconductor material is grown on said portion. Similarly to FIG. 4, the base of the second structure (127) tends to expand beyond the area defined by the top of the undoped nanowires (126) and the exposed portion of the oxide (140) (e.g. by 12%) to form a hexagonal base shape. This second structure (127) will form the drain (or source) of the transistor and may be a nanowire (127). In embodiments where the second structure (127) is a structure with an aspect ratio of at least 2 and in embodiments where the second structure (127) is a nanowire (127), the second structure (127) would appear higher than its width in FIGS. 18-24 to reflect its vertical position and its high aspect ratio (contrarily to the more general structure (127) shown in FIGS. 18-24 which is depicted wider than its height).

Figure 19:
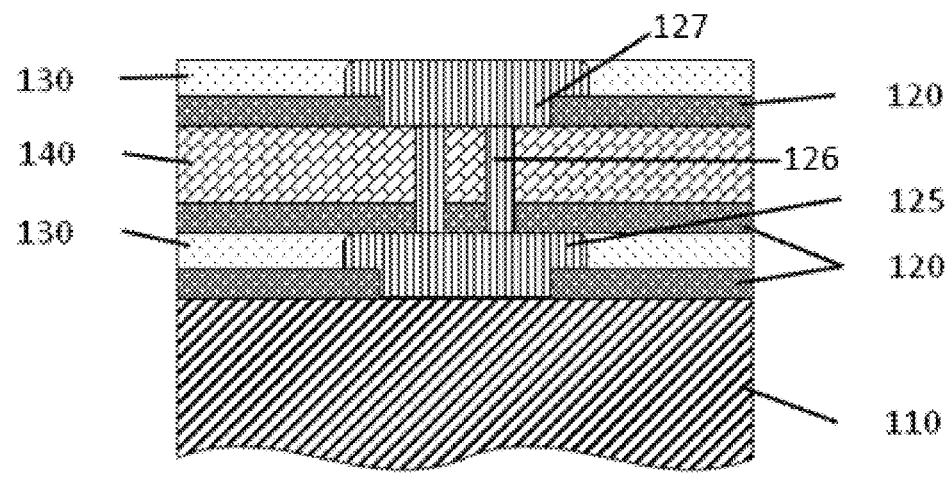

In FIG. 19, a barrier layer (130) is provided on the second structure (127). This barrier layer (130) can for instance be a $Si_3N_4$ layer. It is then planarized until the top of the second structure (127) becomes exposed and is planarized.

Figure 20:
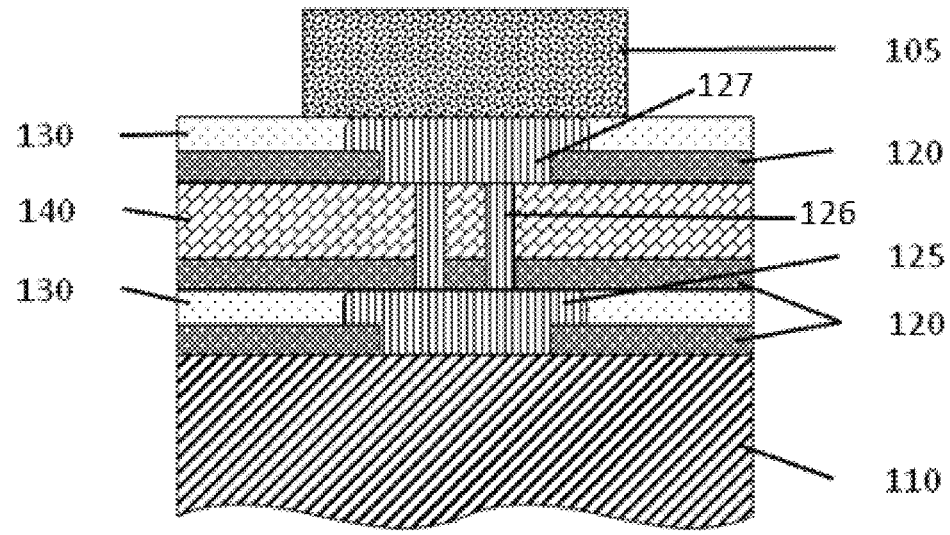

In FIG. 20, an antireflective layer (not shown) is optionally provided on the second structure (127) and the barrier layer (130). A photoresist (105) is then provided on the antireflective layer (if present) or directly on part of the barrier layer (130) and on the second structure (127). If an antireflective layer was present, the photoresist can then be used to plasma etch part of the antireflective layer.

Figure 21:
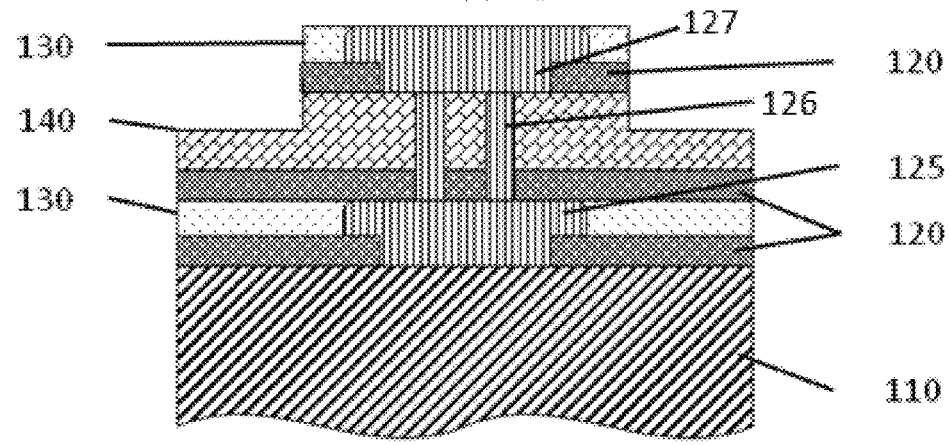

In FIG. 21, a partial etching into the oxide layer (140) (e.g. $SiO_2$ layer) is performed, then, if present, the antireflective coating is plasma etched, then the photoresist (105) is removed by ashing.

Figure 22:
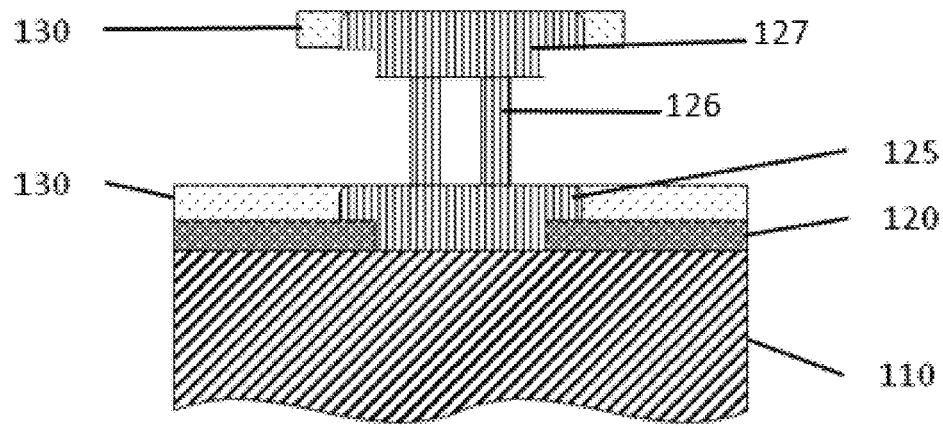

In FIG. 22, a wet etch is performed in diluted HF to remove the rest of the oxide layer (140) and to remove the upper oxide material (120). This removal is selective toward the oxide (120) (e.g. $SiO_2$) and does not remove the barrier layer (130) (e.g. $Si_3N_4$).

Figure 23:
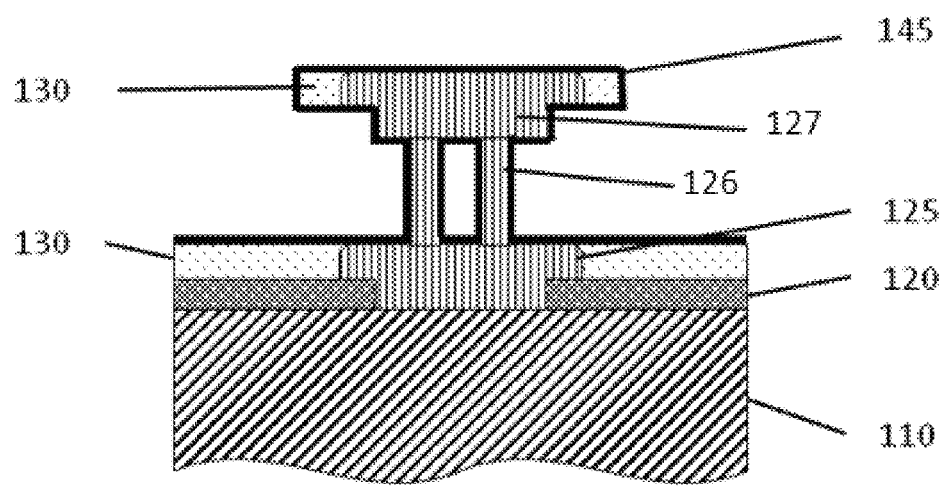

In FIG. 23, a dielectric layer (145) is conformally deposited by ALD. For instance, a $SiO_2$ layer (145) is conformally deposited by ALD, followed by a high-K (145) deposition, also by ALD. Alternatively, only a $SiO_2$ layer (145) or only a High-K layer (145) could be deposited.

Figure 24:
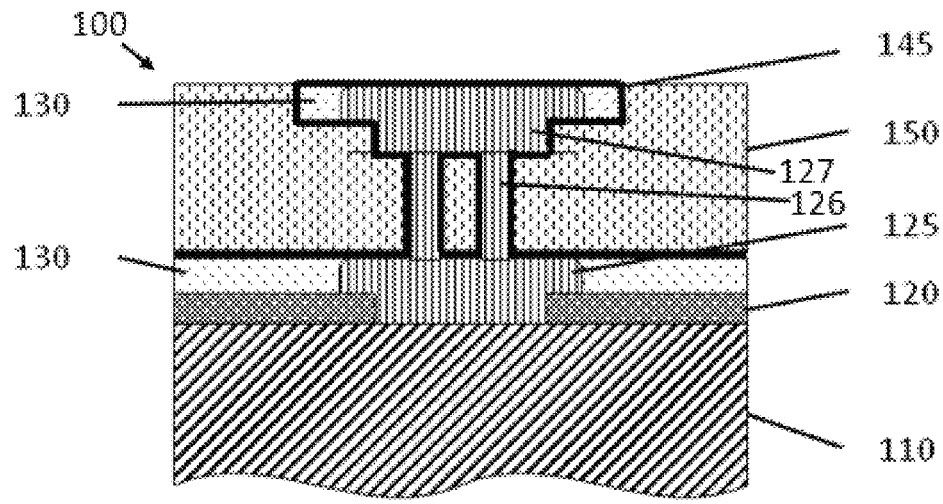

In FIG. 24, metallization with TiN (150) is performed thereby generating a gate metal coating (150) on the undoped (<1e17 at/$cm^3$) nanowires (126), followed by a chemical mechanical planarization.

What is claimed is:

1. A semiconductor structure comprising:
   a first surface, and
   at least one nanowire, the at least one nanowire abutting the first surface and forming an angle therewith,
   wherein the first surface has less than $10^6$ threading dislocations per $cm^2$ and is made of a doped semiconductor material having a doping level of more than $10^{19}$ at/$cm^3$,
   wherein the at least one nanowire is made of an undoped semiconductor material having a doping level of less than $10^{17}$ at/$cm^3$ and having a lattice mismatch with the material of the first surface of from 0% to 1%, and
   wherein the doped semiconductor material and the undoped semiconductor material each have an electron mobility of at least 2000 $cm^2/(V \cdot s)$ or a hole mobility of at least 500 $cm^2/(V \cdot s)$.

2. The semiconductor structure according to claim 1, wherein the first surface has Miller indices (1, 1, 1).

3. The semiconductor structure according to claim 1, wherein there is no lattice mismatch between the material of the first surface and the material of the at least one nanowire.

4. The semiconductor structure according to claim 1, wherein the semiconductor material is the same for the doped semiconductor material of the first surface and for the undoped semiconductor material of the at least one nanowire.

5. The semiconductor structure according to claim 1, wherein the at least one nanowire has a width of from 1 to 20 nm.

6. The semiconductor structure according to claim 1, wherein the at least one nanowire has a first cross section, wherein the first surface is a first extremity of a nanowire having a second cross section, larger than the first cross section, and sufficient for supporting the at least one nanowire.

7. The semiconductor structure according to claim 6, wherein the nanowire having a second cross section possesses the first extremity and a second extremity, and wherein the second extremity is abutting a silicon substrate surface having Miller indices (1, 1, 1).

8. The semiconductor structure according to claim 1, further comprising a second surface made of a doped semiconductor material having a doping level higher than $10^{19}$ at/$cm^3$, wherein the at least one nanowire is sandwiched between the first surface and the second surface.

9. The semiconductor structure according to claim 8, wherein the second surface is an extremity of a nanowire having a cross section sufficient for supporting the at least one nanowire.

10. The semiconductor structure according to claim 1, wherein the doped semiconductor material is a III-V semiconductor material, the undoped semiconductor material is a III-V semiconductor material, or both.

11. A transistor comprising a semiconductor structure, the semiconductor structure comprising:
    a first surface, and
    at least one nanowire, the at least one nanowire abutting the first surface and forming an angle therewith,
    wherein the first surface has less than $10^6$ threading dislocations per cm' and is made of a doped semiconductor material having a doping level of more than $10^{19}$ at/$cm^3$,
    wherein the at least one nanowire is made of an undoped semiconductor material having a doping level of less than $10^{17}$ at/$cm^3$ and having a lattice mismatch with the material of the first surface of from 0% to 1%,
    wherein the doped semiconductor material and the undoped semiconductor material each have an electron mobility of at least 2000 $cm^2/(V \cdot s)$ or a hole mobility of at least 500 $cm^2/(V \cdot s)$, and
    wherein the at least one nanowire comprises a channel of the transistor.

12. A method for forming a semiconductor structure, the method comprising:
    providing a first surface made of a doped semiconductor material having a doping level of more than $10^{19}$ at/$cm^3$, the first surface having less than $10^6$ threading dislocations/$cm^2$, and
    growing at least one nanowire on the first surface and at an angle thereof, the nanowire being made of undoped semiconductor material having a doping level lower than $10^{17}$ at/$cm^3$ and having a lattice mismatch with the material of the first surface of from 0% to 1%,
    wherein the doped semiconductor material and the undoped semiconductor material each have an electron mobility of at least 2000 $cm^2/(V \cdot s)$ or a hole mobility of at least 500 $cm^2/(V \cdot s)$.

13. The method according to claim 12, wherein the at least one nanowire has a first cross-section, and wherein providing the first surface having less than $10^6$ threading dislocations/$cm^2$ comprises growing a nanowire having a second cross-section larger than the first cross-section and sufficient for supporting the at least one nanowire.

14. The method according to claim 13, wherein providing the first surface having less than $10^6$ threading dislocations/$cm^2$ further comprises:
- overlaying the nanowire having a second cross-section with a protective layer,
- providing a patterned hard mask on the protective layer, leaving a portion of the protective layer exposed,
- providing a layer of a block-copolymer on the portion, the block-copolymer being formed of at least two block types, wherein one of the block types is suitable for forming vertical structures spanning the thickness of the layer upon annealing,
- annealing the block-copolymer, thereby generating the vertical structures,
- removing the vertical structures by etching, thereby forming a hole pattern in the block-copolymer, and
- etching the protective layer through the holes and selectively with respect to the first surface.

15. The method according to claim 12, further comprising providing a second surface made of a doped semiconductor material having a doping level higher than $10^{19}$ at/$cm^3$, so that the at least one nanowire is sandwiched between the first surface and the second surface.

* * * * *